United States Patent
Meijer et al.

(10) Patent No.: US 12,326,486 B2
(45) Date of Patent: Jun. 10, 2025

(54) METHOD AND DEVICE FOR DETERMINING A MAGNETIC FLUX DENSITY AND METHOD FOR PRODUCING SUCH A DEVICE

(71) Applicant: Quantum Technologies GmbH, Leipzig (DE)

(72) Inventors: Jan Berend Meijer, Leipzig (DE); Johannes Heitmann, Freiberg (DE)

(73) Assignee: Quantum Technologies GmbH, Leipzig (DE)

( * ) Notice: Subject to any disclaimer, the term of this patent is extended or adjusted under 35 U.S.C. 154(b) by 42 days.

(21) Appl. No.: 18/268,994

(22) PCT Filed: Dec. 17, 2021

(86) PCT No.: PCT/EP2021/086563
§ 371 (c)(1),
(2) Date: Jun. 22, 2023

(87) PCT Pub. No.: WO2022/136175
PCT Pub. Date: Jun. 30, 2022

(65) Prior Publication Data
US 2024/0302456 A1  Sep. 12, 2024

(30) Foreign Application Priority Data
Dec. 23, 2020 (DE) .................. 10 2020 134 883.5

(51) Int. Cl.
*G01R 33/032* (2006.01)
(52) U.S. Cl.
CPC ................. *G01R 33/032* (2013.01)

(58) Field of Classification Search
CPC ............................. G01R 33/032; G01R 33/26
USPC ....................................................... 324/244.1
See application file for complete search history.

(56) References Cited

U.S. PATENT DOCUMENTS

| | | | |
|---|---|---|---|
| 2010/0264913 A1* | 10/2010 | Sandhu | G01R 33/0213 324/214 |
| 2014/0035584 A1 | 2/2014 | Twitchen et al. | |
| 2014/0077231 A1 | 3/2014 | Twitchen et al. | |
| 2016/0174867 A1 | 6/2016 | Hatano et al. | |
| 2016/0313408 A1 | 10/2016 | Hatano et al. | |
| 2016/0324990 A1 | 11/2016 | Acosta et al. | |

(Continued)

FOREIGN PATENT DOCUMENTS

| | | |
|---|---|---|
| DE | 4322830 A1 | 1/1995 |
| DE | 102014219561 A1 | 3/2016 |

(Continued)

OTHER PUBLICATIONS

Krasteva, Nadejda, Berit Guse, Isabelle Besnard, Akio Yasuda, and Tobias Vossmeyer. "Gold nanoparticle/PPI-dendrimer based chemiresistors: Vapor-sensing properties as a function of the dendrimer size." Sensors and Actuators B: Chemical 92, No. 1-2 (2003): 137-143.

(Continued)

*Primary Examiner* — Christopher P McAndrew
(74) *Attorney, Agent, or Firm* — Smartpat PLC

(57) ABSTRACT

A device (10) and a method for determining the magnetic flux density are disclosure which provide a simple and cost-effective sensor unit which still has a good usability. In particular, a correspondingly produced sensor is also very small and can be used in a mobile manner.

13 Claims, 9 Drawing Sheets

(56) References Cited

U.S. PATENT DOCUMENTS

| | | | |
|---|---|---|---|
| 2017/0037540 A1* | 2/2017 | Narayan | C01B 32/188 |
| 2017/0045591 A1 | 2/2017 | Jelezko et al. | |
| 2017/0212182 A1* | 7/2017 | Hahn | G01R 33/60 |
| 2017/0234941 A1 | 8/2017 | Hatano et al. | |
| 2017/0331485 A1* | 11/2017 | Gobet | G04F 5/14 |
| 2017/0363696 A1 | 12/2017 | Hahn et al. | |
| 2018/0202952 A1 | 7/2018 | Lutz et al. | |
| 2019/0154766 A1 | 5/2019 | Lutz et al. | |
| 2020/0048084 A1 | 2/2020 | Acosta et al. | |
| 2022/0364268 A1 | 11/2022 | Meijer et al. | |
| 2022/0397429 A1 | 12/2022 | Burchard et al. | |

FOREIGN PATENT DOCUMENTS

| | | |
|---|---|---|
| DE | 102015208151 A1 | 11/2016 |
| DE | 102017205099 A1 | 9/2018 |
| DE | 102017205265 A1 | 10/2018 |
| DE | 102017205268 A1 | 10/2018 |
| DE | 102018202238 A1 | 8/2019 |
| DE | 102018202588 A1 | 8/2019 |
| DE | 102018202591 A1 | 8/2019 |
| DE | 102018214617 A1 | 3/2020 |
| DE | 102018216033 A1 | 3/2020 |
| DE | 102019203929 A1 | 9/2020 |
| DE | 102019216390 A1 | 4/2021 |
| DE | 102020129349 A1 | 5/2021 |
| JP | 2014095025 A | 5/2014 |
| WO | 2018081577 A1 | 5/2018 |
| WO | 2020260640 A1 | 12/2020 |

OTHER PUBLICATIONS

Liebermeister, Lars, Fabian Petersen, Asmus V. Münchow, Daniel Burchardt, Juliane Hermelbracht, Toshiyuki Tashima, Andreas W. Schell et al. "Tapered fiber coupling of single photons emitted by a deterministically positioned single nitrogen vacancy center." Applied Physics Letters 104, No. 3 (2014): 031101.

Lin, Chun Che, and Ru-Shi Liu. "Advances in phosphors for light-emitting diodes." The journal of physical chemistry letters 2, No. 11 (2011): 1268-1277.

Lunia, Ashok Kumar, Saroj Kanta Patra, Sandeep Kumar, Sumitra Singh, Suchandan Pal, and Chenna Dhanavantri. "Theoretical analysis of blue to white down conversion for light-emitting diode light with yttrium aluminum garnet phosphor." Journal of Photonics for Energy 4, No. 1 (2014): 043596-043596.

Seidel, S., A. Sabelfeld, R. Strohmeyer, G. Schreiber, V. Klemm, D. Rafaja, Y. Joseph, and J. Heitmann. "Temperature stable Au nanoparticles embedded in Er3+ doped ZrO2 sol-gel thin films prepared by spin coating." Thin Solid Films 606 (2016): 13-18.

Stürner, Felix M., Andreas Brenneis, Julian Kassel, Uwe Wostradowski, Robert Roelver, Tino Fuchs, Kazuo Nakamura et al. "Compact integrated magnetometer based on nitrogen-vacancy centres in diamond." Diamond and Related Materials 93 (2019): 59-65.

Tegetmeyer, B., Schreyvogel, C., Lang, N., Müller-Sebert, W., Brink, D. and Nebel, C.E., 2016. Electroluminescence from silicon vacancy centers in diamond p-i-n diodes. Diamond and Related Materials, 65, pp. 42-46.

* cited by examiner

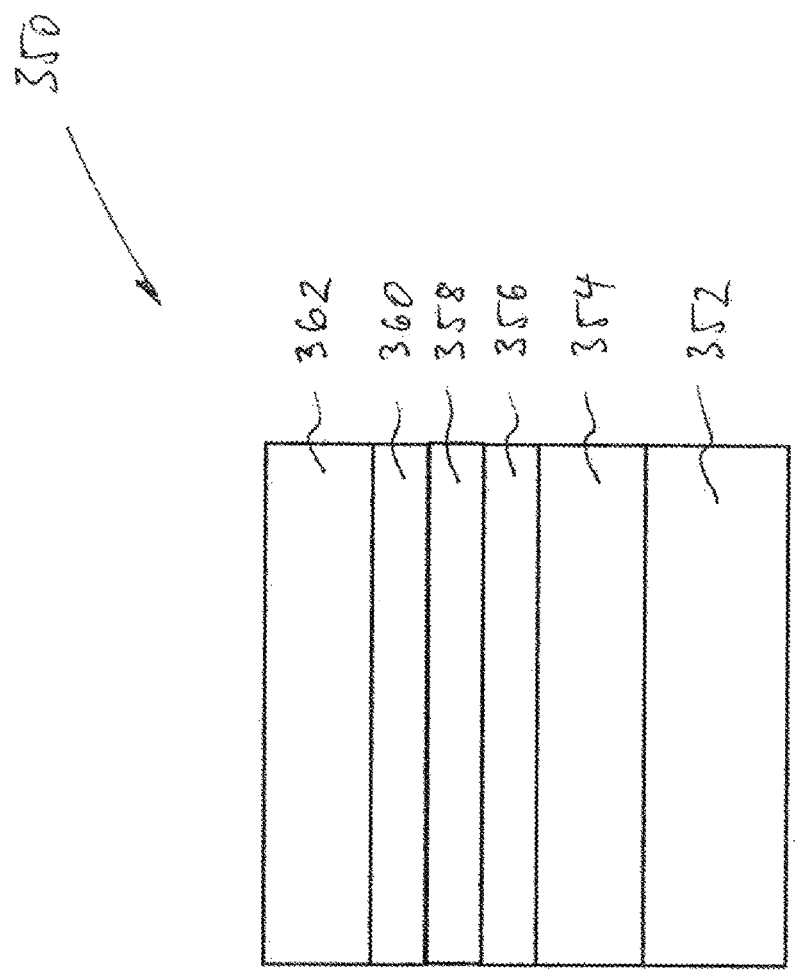

METHOD AND DEVICE FOR DETERMINING A MAGNETIC FLUX DENSITY AND METHOD FOR PRODUCING SUCH A DEVICE

CROSS-REFERENCE TO RELATED APPLICATION

This application is a national stage application, filed under 35 U.S.C. § 371, of International Patent Application PCT/EP2021/086563 filed on Dec. 17, 2021, which claims the benefit of German Patent Application DE 10 2020 134 883.5 filed on Dec. 23, 2020.

TECHNICAL FIELD

The invention relates to a device for determining a magnetic flux density and a method for determining a magnetic flux density with such a device and to a method for producing a device for determining the magnetic flux density.

BACKGROUND

The measurement of magnetic flux densities is a basic function of sensor technology in order to determine magnetic field strengths, the current flows that cause them, and also other physical quantities.

Methods are known from DE 10 2015 208 151 A1 and DE 10 2017 205 099 A1 in which the fluorescence intensity of a diamond material with a nitrogen vacancy centre is evaluated in order to be able to infer the magnetic field acting on the nitrogen vacancy centre and the electric current of a conductor causing this magnetic field. Two different excitations are used, namely an optical and a microwave excitation of the nitrogen vacancy centre, which makes the corresponding device expensive and complex.

The article by F. M. Stürner et al.: "Compact integrated magnetometer based on nitrogen vacancy centres in diamond", Diamond & Related Material 93 (2019) 59-65, already gives a relatively compact sensor, but it still has a considerable size of about 2.9 cm$^3$, wherein this size does not take into account the required microwave excitation, which has to be provided externally.

SUMMARY

It is the object of the present disclosure to enable the measurement of magnetic flux density within the framework of a simple and inexpensive sensor system which nevertheless has good usability. In particular, a corresponding sensor should also be very small and mobile.

This object is achieved by the device for determining a magnetic flux density as described herein and the method for determining a magnetic flux density with this device as described herein and the method for producing a device for determining the magnetic flux density as described herein. Advantageous developments are provided in the claims and in the following description together with the figures.

In the context of the present disclosure, a distinction is made between magnetic field strength (magnetic excitation) and magnetic flux density. Strictly speaking, the magnetic flux density B is dependent on the magnetic excitation H according to the relationship $B = \mu_0 \mu_r H$, where $\mu_0$ is the magnetic field constant and $\mu_r$ is the permeability number. The magnetic flux density is measured, while a magnetic field with a certain field strength is generated when current flows through a conductor, in particular a coil.

On the part of the inventors, it was recognised that this object can be achieved in a surprisingly simple manner by using the dependence of a luminescence or a photocurrent on the magnetic flux density for a specific material to determine the magnetic flux density, wherein the material is integrated in one piece in the sensor system. This makes the corresponding sensor technology particularly compact. If the physical excitation is brought very close to the material by the one-piece construction, there is a very high yield and thus usability.

There are numerous materials for which such dependencies of a luminescence or a photocurrent on the magnetic flux density exist. For example, diamonds with nitrogen vacancy centres may be referred to for the dependence of luminescence on magnetic flux density. Furthermore, there is a close connection between luminescence and photocurrent ("Der Zusammenhang von Elektronenemission und Lumineszenzerscheinungen angeregter Kristalle" [The relationship between electron emission and luminescence phenomena of excited crystals], Z. Naturforschg. 10a, 47-52 (1955)).

The corresponding dependencies of the luminescence intensity or the photocurrent intensity are monotonic over wide ranges of the magnetic flux density and continuously decreasing with increasing magnetic flux densities, so that the magnetic flux density in these ranges can easily be determined by measuring the respective intensity. For example, this dependence for the nitrogen vacancy centre in diamond develops monotonically and continuously decreasing ("luminescence quenching") in the range of a magnetic flux density from 0 mT to 51.2 mT (the position of the NV-P1 resonance), so that magnetic flux densities can be determined in this range with a sensor system based on this.

If NV centres are present in several non-aligned diamond nanoparticles, a monotonous and continuously decreasing dependence over the range of magnetic flux density from approx. 5 mT to approx. 200 mT becomes apparent. A similar dependence would also be shown if instead of nanoparticles the diamond material were present as an extended layer or bulk material, which is also not aligned with respect to its NV centres, wherein for the bulk material the structures (GSLAC, NV-P1 resonance, etc.) are still somewhat visible.

The device for determining the magnetic flux density has a first material, which generates a luminescence and/or a photocurrent upon physical excitation, wherein the luminescence or photocurrent is dependent on the magnetic flux density, means for generating the physical excitation and means for measuring the luminescence or photocurrent with a detection signal representing the strength of the detected luminescence signal or photocurrent signal, and is characterised in that the first material and the means for generating the physical excitation are formed in one piece and/or the first material and the means for measuring the luminescence or the photocurrent are formed in one piece.

"Means for generating physical excitation" are any means with which the physical excitation can be generated. It does not matter that the magnitude of the physical excitation is actually variable. It is sufficient if the physical excitation can be generated in such a way that a luminescence or photocurrent is excited in the first material.

In the context of the present invention, "one piece" means that the components joined together in one piece, although not made from a single and uniform part ("integrally"), are not only firmly but so closely joined together that they do not appear to be several components joined together and in any case can no longer be detached from each other without being destroyed.

"One piece" therefore moves between the conceptual poles of mere "sufficiently firm connection" and "a single part".

In an advantageous further development, it is provided that the first material and the means for generating the physical excitation are formed integrally and/or the first material and the means for measuring the luminescence or the photocurrent are formed integrally. This makes the sensor system even more compact, because the corresponding components of the device are built directly on top of each other, possibly with the interposition of other components. For example, these components can be created as layers or layer packs directly on top of each other.

In an advantageous further development, it is provided that the first material and the means for generating the physical excitation and/or the first material and the means for measuring the luminescence or the photocurrent are present as layers of a layer stack. This makes the device particularly compact. The layer stack can exist with or without a separate substrate and can assume different sequences in relation to such a substrate. For example, the sequence could be substrate, means for generating the physical excitation, material, means for measuring the luminescence or photocurrent. This sequence could be substrate, means for measuring the luminescence or photocurrent, material, means for generating the physical excitation. In addition, this sequence could be substrate, means for measuring the luminescence or photocurrent, means for generating the physical excitation material. Furthermore, the sequence could be substrate, material, means for generating the physical excitation, means for measuring the luminescence or photocurrent. In each case, there could still be layers in between.

In an advantageous further development, it is provided that between the means for generating the physical excitation and the means for measuring the luminescence or of the photocurrent, means for damping the physical excitation are arranged, wherein the means for damping are preferably designed as dielectric mirrors, in particular as Bragg mirrors. This increases the measurement accuracy because the excitation does not falsify the measurement.

In an advantageous further development, it is provided that the first material has a crystal structure with at least one vacancy, wherein the first material is preferably diamond, silicon carbide or silicon and the vacancy is a colour centre, in particular a nitrogen vacancy centre or a nitrogen vacancy centre in combination with a europium vacancy centre, a vanadium vacancy centre or a manganese vacancy centre. These materials have very well known luminescence patterns. At this point, reference should be made to A. Zaitsev, "Optical Properties of Diamond", 2001, Springer, Berlin, where numerous suitable colour centres in diamond are given. The disclosure content of this publication with respect to colour centres in diamond is hereby incorporated in its entirety. This first material may, for example, be in the form of an Ib-type diamond naturally having nitrogen vacancy centres, or it may be in the form of a diamond or diamond layer in which nitrogen vacancy centres have been subsequently created, as shown, for example, in PCT/EP2020/068110, the contents of which are hereby incorporated in their entirety. Preferably, the diamond material is not aligned with respect to its NV centres, because then a monotonically and continuously decreasing dependence of the luminescence on the magnetic flux density results over the range of the magnetic flux density from approx. 5 mT to approx. 200 mT.

The maximum slope and thus the greatest measurement sensitivity is found in the range of approx. 10 mT to approx. 15 mT. It is therefore advantageous to use a compensation circuit to always determine the luminescence in this range of magnetic flux density. For this purpose, one would, for example, allow an electric current to flow through a coil and thereby regulate the current in such a way that a constant luminescence occurs, which corresponds, for example, to a magnetic flux density of 12 mT. The magnetic flux density to be measured can then be inferred from the injected current. It is therefore a compensation circuit to maintain a fixed value of the measured luminescence.

Alternatively or additionally, a magnetic flux density of at least 5 mT, preferably at least 7 mT, in particular at least 10 mT, can be applied in order to make the measurement result unambiguously determinable in view of the maximum of the luminescence at approx. 5 mT. This bias with respect to the magnetic flux density prevents luminescence from being measured in the rise between 0 mT and 5 mT.

In an advantageous embodiment, it is thus provided that means are provided for generating a magnetic flux density,
  wherein the means for generating a magnetic flux density are adapted to generate a magnetic flux density of at least 5 mT, preferably at least 7 mT, in particular at least 10 mT, and/or
  wherein the means for generating a magnetic flux density are adapted to be regulated in such a way that a certain luminescence is achieved.

Providing a bias or compensation is possible for any first material. In addition, bias or compensation can be used advantageously not only in a luminescence measurement, but also in a photocurrent measurement.

In an advantageous further development, it is provided that the means for generating the physical excitation provide an electrical or electromagnetic excitation, preferably an excitation in the optical range, in particular a LASER excitation or an LED excitation, or an excitation by ionising radiation. This makes it very easy to excite a luminescence or photocurrent, and the means can be kept very compact. The LEDs can be semiconductor LEDs, but do not have to be. Preferably, no microwave excitation is performed because then the device can be kept very compact.

If electrical excitation (for example with electrical contacts) is used instead of electromagnetic excitation, then LEDs can be omitted for optical excitation, for example, which makes corresponding sensor technology much more compact. In addition, it would be possible to greatly increase the spatial resolution of a corresponding sensor. More precisely, the excitation could be limited to a much smaller area by electrical contacts and, in contrast to optical detection, signals would not be obtained from the whole material. Until now, electrical excitation had failed because the NV centre in diamond was ionised, but this can be prevented by raising the Fermi level, for example by phosphorus doping in diamond.

In an advantageous further development, it is provided that transparent electrical contacts are present on the first material. For example, so-called transparent conducting oxides (TCO), such as indium tin oxide (ITO), fluorine tin oxide, aluminium zinc oxide or antimony tin oxide, could be used. These contacts can be used for reading the photocurrent as well as for electrical excitation.

Exemplary methods of electrical excitations of colour cents in diamond are known e.g. from DE 43 22 830 A1 and from B. Burchard "Elektronische und optoelektronische Bauelemente und Bauelemente Grundstrukturen auf Diamantbasis" [Electronic and optoelectronic components and devices Basic structures based on diamond], Dissertation, Hagen, 1994. In particular, the excitation of the luminescence can be carried out by PIP or PIN diodes. In this regard, reference can be made to B. Tegetmeyer et Al. "Charge state modulation of nitrogen vacancy centers in diamond by applying a forward voltage across a p-i-n junction", Diamond and Related Materials, volume 65, May 2016, pages 42-46 and B. Teget-meyer et Al. "Electroluminescence from silicon vacancy centers in diamond p-i-n diodes" Diamond and Related Materials, volume 65, May 2016, pages 42-46. Excitation via PN diodes is also conceivable. In the exemplary use of diamond and a PIP diode, when a sufficiently high voltage is applied to the PIP diode, a first doped region, for example a p+-doped region, injects charge carriers—in this case holes—into the intrinsic region. There, they are accelerated by the electric field of the applied voltage and excite the colour centres by impacts, whereupon they begin to luminesce. More efficient is the excitation via the injection of electrons and holes, for example in PIN diodes. Through bandgap engineering or the use of other materials, direct transitions can also be created, but then other colour centres must be used, as colour centres are always material-specific. It is conceivable to couple LEDs, such as those described above, only capacitively or by means of transformers or otherwise galvanically isolated to an alternating signal source. This is particularly advantageous for CMOS integration.

In an advantageous further development, it is provided that the means for generating the physical excitation comprise a source and conversion means, wherein the source generates a first physical excitation and the conversion means convert the first physical excitation into a second physical excitation. Sources with a high intensity can then be used to increase the measurement accuracy. For example, excitation could occur in the blue light spectrum, wherein the conversion means absorb this excitation and in turn emit light in the green light spectrum, which then excites luminescence in the material.

In an advantageous further development, it is provided that the means for generating the physical excitation comprise a second material from the group: AlN, AlGaN, AlGaInN, C, BN, GaN, GaP, GaAsP, AlGaInP, AlGaP, InGaN, Znü; ZnSe, SiC and Si. LED structures with these materials are suitable for emitting light in the ultraviolet (AlN, AlGaN, AlGaInN, C, BN), violet (InGaN) blue (ZnSe, InGaN, SiC, Si, ZnO), green (InGaN, GaN, GaP, AlGaInP, AlGaP, Znü) or yellow (GaAsP, AlGaInP, GaP) light spectrum with high intensity.

In an advantageous further development, it is provided that the conversion means comprise a third material from the group: phosphor material, metallic nanoclusters, rare earths, CdS, CdSe, CdTe, GaAs and InP. Here, reference is made to the two publications C. C. Lin and R.-S. Liu: "Advances in Phosphors for Light-emitting Diodes", J. Phys. Chem. Lett. 2011, 2, 1268-1277 and A. K. Lunia et al.: "Theoretical analysis of blue to white down conversion for light-emitting diodes with yttrium aluminium garnet phosphor", Journal of Photonics for Energy, vol. 4, 2014, 043596-1-043596-10, the contents of which are hereby incorporated in their entirety. These publications show that a green phosphor material, for example with the composition SrAl204/Eu, can be used for a conversion of blue light into green light. Furthermore, it emerges that semiconductor nanocrystals and quantum dots can also be used for such a conversion, wherein an adjustment of the desired emission can be made by adjusting the size of these elements, wherein advantageously a broad absorption band but only a narrow emission band exist. In addition, the quantum yield is high and light scattering is low.

The materials CdS, CdSe, CdTe, GaAs and InP, for example, can be used to produce such quantum dots. Nanocrystals can be embedded together with rare earths in a corresponding phosphor material.

Metallic nanoclusters can be used to generate surface plasmons (plasmonic near field), which in turn cause conversion. For example, the plasmonic near field can be used to excite NV centres. In S. Seidel, J. Heitmann et al. Thin Solid Films. 606, 13-18 (2016), the embedding of Au nanoclusters in SolGel-$ZrO_2$ with high thermal stability was demonstrated. The Au nanoclusters show a surface plasmon resonance (SPR) in the range 540-590 nm, which is adjustable via the size of the clusters and the crystallinity of the matrix material. This wavelength corresponds to the optimal excitation energy of the NV centres. The excitation is more efficient than a purely radiating excitation due to the near field of the SPR.

In an advantageous further development, it is provided that at least parts of the means for generation, preferably the conversion means, are present in a matrix with the first material, in particular as part of a common layer. The incorporation of the conversion means into the matrix layer can be done, for example, by a sol-gel method, a SOG method (spin on glass method) or by inkjet printing. The physical excitation is then particularly effective. In addition, non-radiative excitation, for example by Förster transfer, can take place, which once again significantly increases the efficiency of the excitation. Especially when the material is homogeneously distributed in the matrix, a Förster transfer can be induced. In L. Liebermeister et al.: "Tapered fiber coupling of single photons emitted be deterministic positioned single nitrogen vacancy center", Appl. Phys. Lett. 104, 031101 (2014) the possibility of using a forester transfer to stimulate NV centres was already shown in principle. For the excitation of such a Förster transfer, the closest possible proximity of the first material and the conversion material is also helpful, since the excitation efficiency decreases proportionally to the 6th power of the distance.

Alternatively, the conversion means and the first material can also be present separately from each other, in particular in different layers. However, a directly adjacent arrangement of the two layers is preferred.

In an advantageous further development, it is provided that the first material has grains, which preferably have a grain size in the range from 100 nm to 10 µm, preferably in the range from 200 nm to 3 µm, in particular in the range from 500 nm to 1 µm. The first material can then be produced particularly easily and a matrix with the conversion means could also be produced easily.

Alternatively, the first material could also be created as a closed layer. For example, a diamond layer could be deposited and nitrogen vacancy centres subsequently created therein.

In a further development, it is provided that the means for measuring the luminescence comprise a photodetector.

This makes the sensor technology particularly easy and cost-effective to represent. The sensitivity range of the photodetector shall be based on the spectrum of the luminescence. Such a photodetector could be, for example, a semiconductor photodetector, for example, a-Si based or a c-Si pn diode if light in the red spectral range is to be detected, as is the case with nitrogen vacancy centres in diamond.

In a particularly preferred further development, an LED structure based on GaN as the second material consists of a matrix layer containing diamond grains with nitrogen vacancy centres as the first material and a conversion means in the form of particles of green phosphor material as the third material, wherein the diamond grains and the particles of green phosphor material are mixed, for example in a silicon-based precursor solution, and deposited together in a sol-gel method.

The device is then particularly efficient and compact. The excitation of the nitrogen vacancy centres can also take place without radiation via a Förster transfer.

Independent protection is claimed for the method for producing a device for determining the magnetic flux density, wherein the device has a first material, which generates a luminescence and/or a photocurrent upon physical excitation, wherein the luminescence or photocurrent is dependent on the magnetic flux density, means for generating the physical excitation and means for measuring the luminescence or photocurrent with a detection signal representing the strength of the detected luminescence signal or photocurrent signal, and is characterised in that the first material and the means for generating the physical excitation are formed in one piece and/or the first material and the means for measuring the luminescence or the photocurrent are formed in one piece.

In an advantageous embodiment, it is provided that the device for determining the magnetic flux density is produced.

In an advantageous further development, it is provided that an LED structure is generated and the first material is arranged thereon, preferably deposited, wherein the first material is arranged in particular in a matrix with the conversion means.

In an advantageous further development, it is provided that the first material and possible the conversion means are deposited using the sol-gel method.

In an advantageous further development, it is provided that the means for damping are arranged opposite the LED structure on the first material and, thereon, the means for measuring luminescence or the LED structure, the first material, the means for damping, and the means for measuring the luminescence or the photocurrent are preferably arranged directly on top of one another, or This makes the sensor technology very compact, in particular in the form of a single chip.

In an alternative advantageous further development, it is provided that the means for damping are arranged opposite the first material on the LED structure and the means for measuring the luminescence or photocurrent are arranged thereon, wherein the means for measuring the luminescence or photocurrent, the means for damping, the LED structure and the first material are preferably arranged directly on top of one another. This makes the sensor technology very compact, in particular in the form of a single chip.

Furthermore, independent protection is claimed for the method for determining a magnetic flux density with the device for determining the magnetic flux density, which is characterised in that the magnitude of the current magnetic flux density is determined from the value of the measured intensity of the luminescence or of the photocurrent with respect to a normalised curve of the intensity of the luminescence or of the photocurrent with respect to the magnetic flux density, wherein preferably no microwave excitation takes place.

In an advantageous further development, it is thus provided that means for generating a magnetic flux density are used, wherein the means for generating a magnetic flux density generate a magnetic flux density of at least 5 mT, preferably at least 7 mT, in particular at least 10 mT, and/or
wherein the means for generating a magnetic flux density are regulated in such a way that a certain luminescence is achieved.

BRIEF DESCRIPTION OF THE DRAWINGS

The features and further advantages of the present invention will become clear below from the description of preferred exemplary embodiments in connection with the figures. In the figures, the following is shown purely schematically:

FIG. 9 shows an eighth preferred embodiment of the device for determining the magnetic flux density.

DETAILED DESCRIPTION

Figure 1:
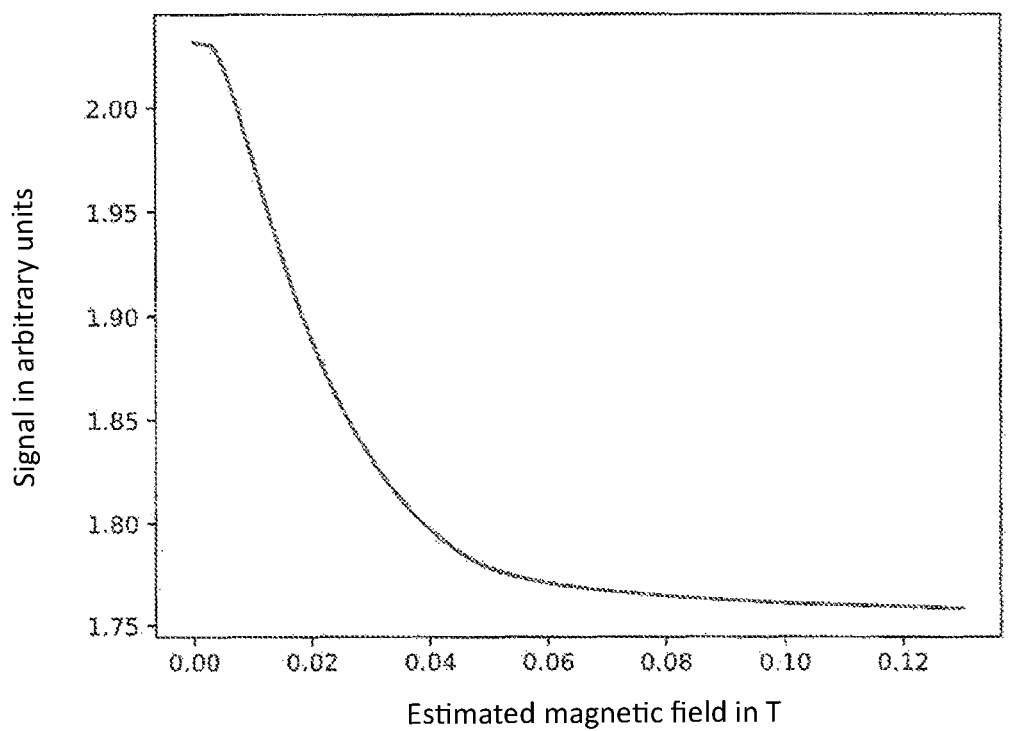
FIG. 1 shows the dependence of the intensity of photoluminescence of NV centres in non-aligned diamond nanoparticles on the magnitude of the magnetic flux density.

In the following, identical reference numerals are used for identical elements.

Colour centres are lattice vacancies in crystals that absorb electromagnetic radiation (for example in the UV, visible and/or IR range). This creates bands with a specific wavelength.

Nitrogen vacancy (NV) centre in diamond has been very thoroughly studied. This is one of over 100 known defects in diamond, which results from a carbon atom in the diamond lattice being substituted by a nitrogen atom and its neighbouring atom being missing. The diamond of type Ib is known, in which these NV centres are evenly distributed over the entire diamond structure.

The photoluminescence of this NV centre is strongly dependent on the magnetic flux of a magnetic field acting on the NV centre.

FIG. 1 shows the intensity of photoluminescence of NV centres in non-aligned diamond nanoparticles in dependence on the magnitude of the magnetic flux density. It can be seen that in this case a largely structure-free dependency is evident. A similar dependence would also be shown if instead of nanoparticles the diamond material were present as an extended layer or bulk material, which is also not aligned with respect to its NV centres.

The luminescence of negatively charged NV centres occurs in a wavelength range of 600-800 nm with a zero phonon line at 638 nm. The NV centre can be excited with wavelengths less than or equal to 638 nm. By means of imprinted mechanical stresses in the crystal (e.g. through cavities or high pressure), it is possible to shift the necessary excitation energies and to change the luminescence characteristics.

Figure 2:
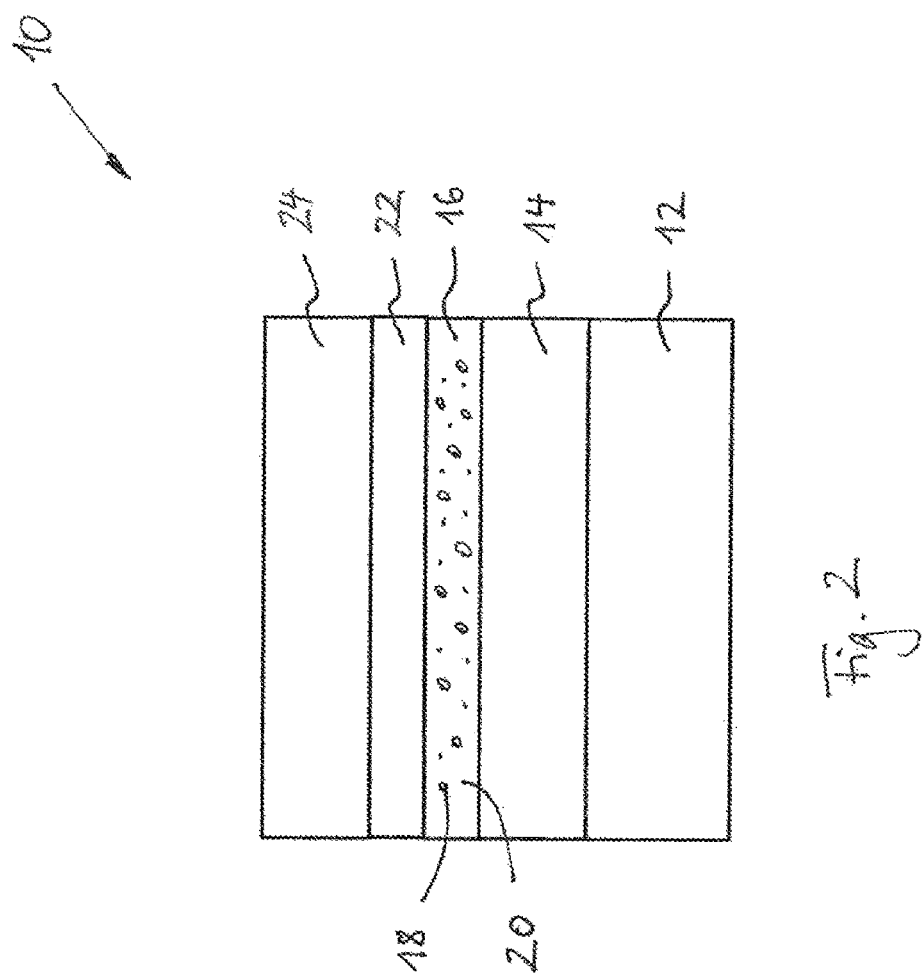
FIG. 2 shows a first preferred embodiment of the device for determining the magnetic flux density.

FIG. 2 shows a first preferred embodiment of the device 10 for determining the magnetic flux density in a schematic sectional view.

It can be seen that this device 10 comprises a substrate 12, for example of silicon, on which a GaN-based LED structure 14 (for example in a GaN/SiC/AlN/ZnO layered structure) has been produced in a known manner by CVD deposition.

This LED structure 14 has electrical connections (not shown), which are preferably designed as TCOs and connected in the usual way with terminal connections that can be supplied from the outside. The LED structure 14 is preferably set to an emission maximum at 200 nm to 500 nm.

A matrix layer 16 containing both diamond grains 18 and conversion means 20 was placed directly on the LED structure 14. For this purpose, the diamond grains 18 as well as the conversion means 20 were stirred into a precursor solution within the framework of a sol-gel method and a suspension was formed from this, which was then deposited on the LED structure and cured in the usual manner.

The diamond grains 18 are grains with a grain size in the range 500 nm to 1 μm and consist of Ib-type diamond. They thus have nitrogen vacancy centres that can be excited below a wavelength of 638 nm.

Phosphorus materials, for example SrAl2O4/Eu, are used as conversion means 20.

The very intense radiation at 200 nm to 500 nm emitted by the GaN-based LED structure 14 is converted by the conversion means 20 to a wavelength range from 500 nm to 600 nm, where excitation of the nitrogen vacancy centres is very efficient. This means that the very high luminosity of the LED structure 14 can in any case act optimally to radiatively excite the nitrogen vacancy centres.

If the diamond grains 18 are very homogeneously distributed in the matrix layer 16 and the conversion means 20 are very closely attached to the diamond grains, then a radiation-free Förster transfer can also occur, whereby the excitation of the nitrogen defect centres is even more efficient.

A dielectric filter in the form of a Bragg mirror 22 was deposited directly on the matrix layer 16 by means of CVD, which has, for example, a large number of $SiO_2$ and SiN layers arranged alternately on top of each other with a certain layer thickness. This Bragg mirror filters the light emissions from both the LED structure and the conversion agents so that only the light emissions from the nitrogen vacancy centres in the 600 nm to 750 nm range are transmitted.

Finally, a photodiode structure 24 with corresponding electrical connections was deposited on the Bragg mirror 22 using CVD. Here, too, the electrical connections can again preferably be designed as TCOs and connected in the usual way with terminal connections that can be contacted from the outside.

The device 10 described is in the form of a one-piece component and can be manufactured very small as a microsensor. Additional excitation with microwave radiation is not necessary.

This device 10 would now be calibrated using known magnetic flux densities with respect to the measurement signal of the photodiode structure 24. Then any magnetic flux densities in the range of approx. 5 mT to approx. 200 mT can be determined simply by evaluating the measurement signal of the photodiode structure 24, since the dependence of the luminescence intensity of the nitrogen vacancy centres is monotonic over this range of magnetic flux density and falls continuously ("luminescence quenching").

If necessary, a magnetic flux density bias of at least 5 mT would be used and/or a compensation circuit would be used, whereby the magnetic flux density to be measured is determined by keeping the measured luminescence constant at a value corresponding to a magnetic flux density of, for example, 12 mT. The magnetic flux density to be measured can then be determined directly from the current required to generate the magnetic flux density necessary for compensation, which flows through a corresponding coil.

Figure 3:
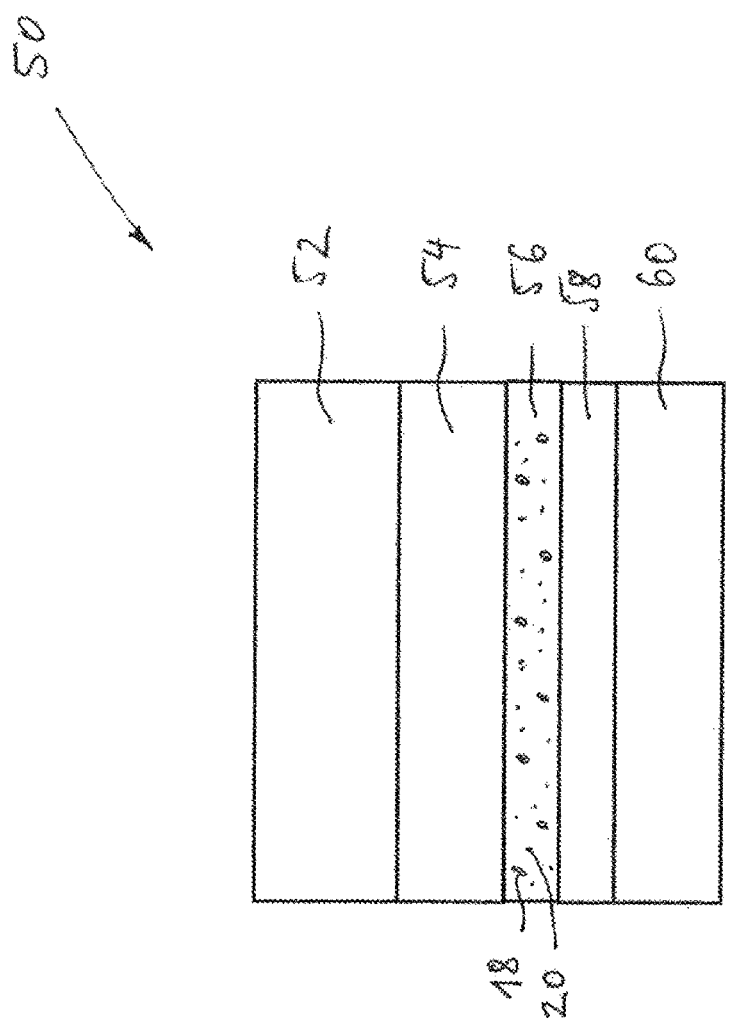
FIG. 3 shows a second preferred embodiment of the device for determining the magnetic flux density.

FIG. 3 shows a second preferred embodiment of the device 50 for determining the magnetic flux density purely schematically in section.

It can be seen that this device 50 differs from the device 10 of FIG. 2 only in that the layer sequence on the substrate 52 has been reversed. In this case, the photodiode structure 54 was deposited directly on the substrate 52, followed by the matrix layer 56 with the diamond grains 18 and the phosphor material 20, then the Bragg mirror 58 and the LED structure 60.

The principle mode of operation is the same as for device 10, so this need not be repeated again.

Figure 4:
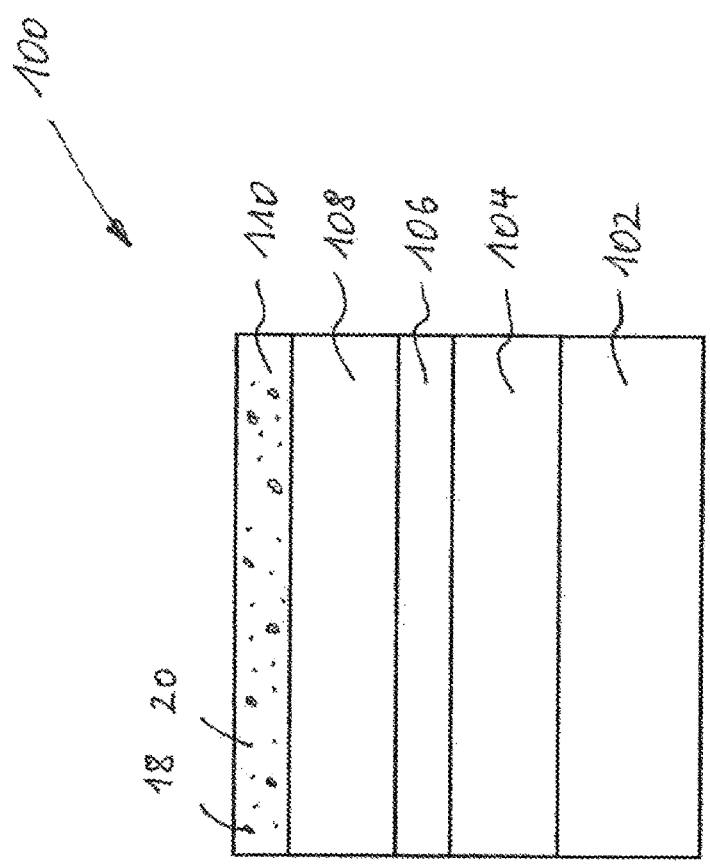
FIG. 4 shows a third preferred embodiment of the device for determining the magnetic flux density.

FIG. 4 shows a third preferred embodiment of the device 100 for determining the magnetic flux density purely schematically in section.

It can be seen that this device 100 differs from the device 10 of FIG. 2 in that the photodiode structure 104 was deposited directly on the substrate 102, the Bragg mirror 106 was deposited thereon, the LED structure 108 was deposited thereon, and finally the matrix layer 110 containing the diamond grains 18 and the phosphor material 20 was deposited thereon.

Advantage is taken of the fact that the LED structure 108 is transparent to the luminescence of the nitrogen vacancy centres in the diamond grains 18. Otherwise, the principle mode of operation is the same as for device 10, so this need not be repeated again.

Figure 5:
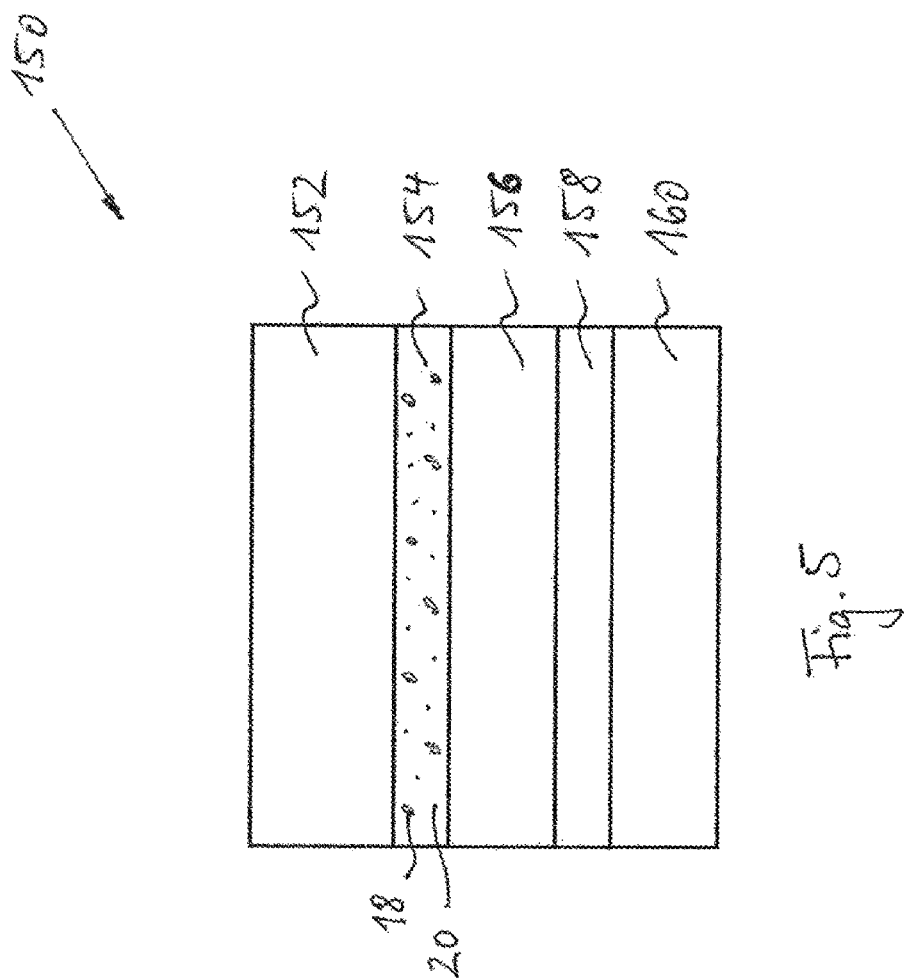
FIG. 5 shows a fourth preferred embodiment of the device for determining the magnetic flux density.

FIG. 5 shows a fourth preferred embodiment of the device 150 for determining the magnetic flux density purely schematically in section.

It can be seen that this device 150 differs from the device 100 of FIG. 4 only in that the layer sequence on the substrate 152 has been reversed. In this case, the matrix layer 154 with the diamond grains 18 and the phosphor material 20 was deposited directly on the substrate 152, the LED structure 156 was deposited thereon, the Bragg mirror 158 was deposited thereon and the photodiode structure 160 was deposited thereon.

The principle mode of operation is the same as for device 100, so this need not be repeated again.

Figure 6:
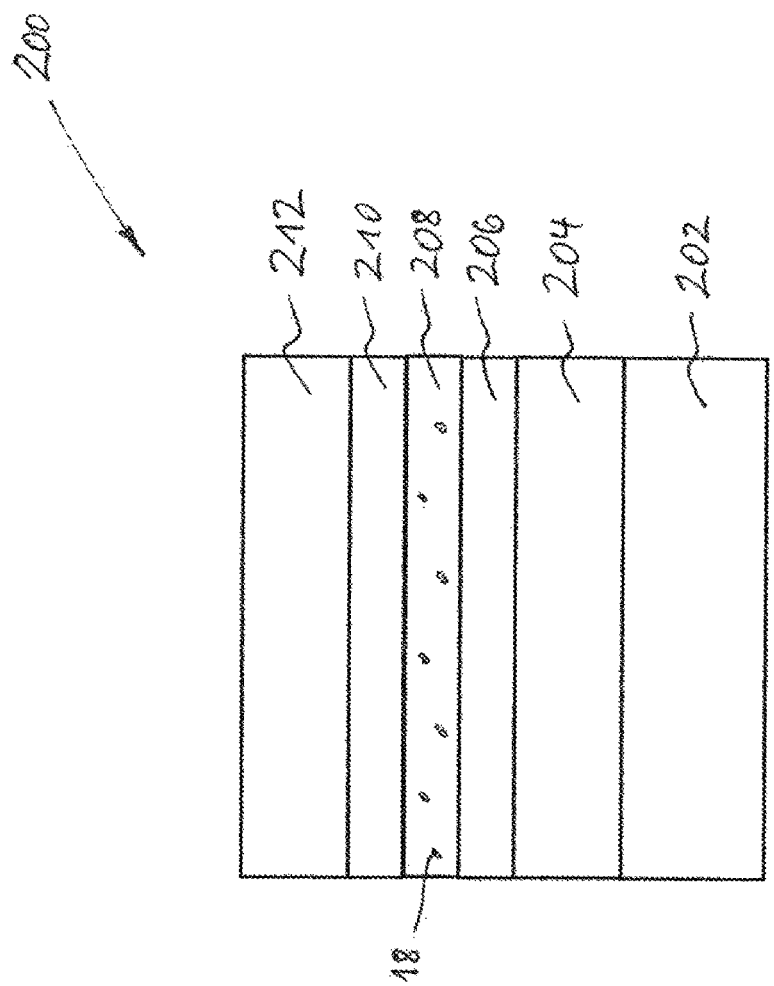
FIG. 6 shows a fifth preferred embodiment of the device for determining the magnetic flux density.

FIG. 6 shows a fifth preferred embodiment of the device 200 for determining the magnetic flux density purely schematically in section.

It can be seen that this device 200 differs from the device 10 of FIG. 2 in that there is no single matrix layer 16, but rather two separate layers 206, 208.

More specifically, in this device there is again directly on the substrate 202 an LED structure 204, on top of that a layer 206 with green phosphor material deposited by CVD, on top of that a layer 208 with diamond grains 18 deposited again by sol-gel method, on top of that the Bragg mirror 210 and on top of that the photodiode structure 212.

In this device 200, wavelength conversion also takes place, but here, due to the spatial distance between diamond grains 18 and phosphor material 206, no Förster transfer is to be expected, so that the excitation of the nitrogen defect n centres in diamond grains 18 will be predominantly radiative.

Figure 7:
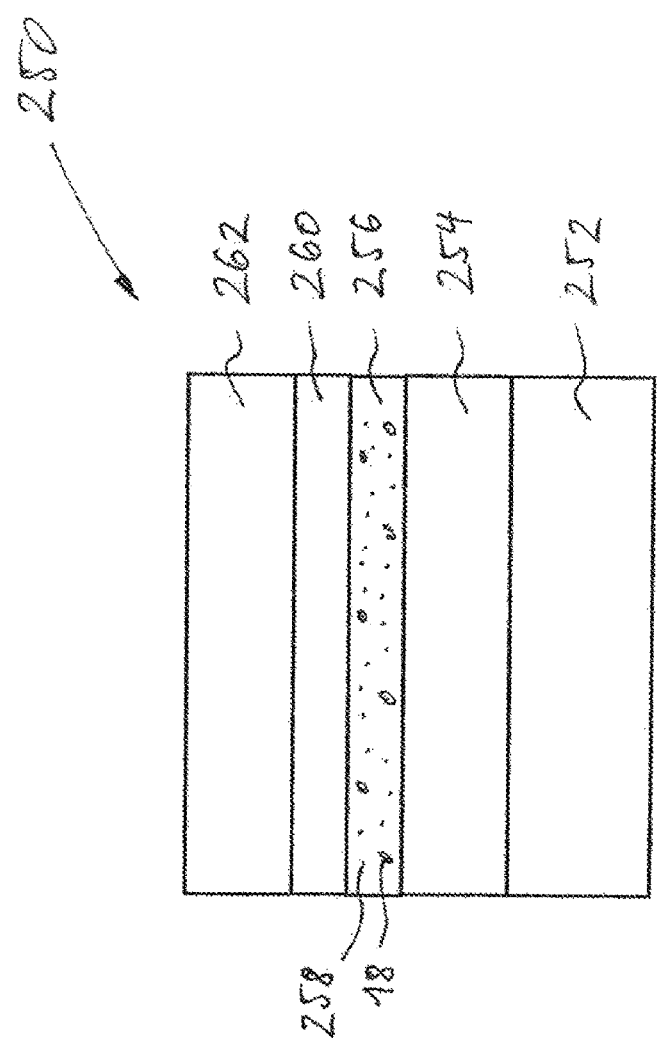
FIG. 7 shows a sixth preferred embodiment of the device for determining the magnetic flux density.

FIG. 7 shows a sixth preferred embodiment of the device 250 for determining the magnetic flux density purely schematically in section.

It can be seen that this device 250 differs from the device 10 of FIG. 2 only in that there are no particles 20 of green phosphorus material, but instead semiconductor nanocrystals 258, for example of CdS, CdSe, CdTe, GaAs and/or InP, which have a size in the range from 5 nm to 50 nm, are present in the uniform matrix layer 256 in addition to the diamond grains 18 . . . . Alternatively, metallic nanoclusters of, for example, Au or Ag could be used to effect conversion by means of surface plasmons. The size of these nanoclusters could be in the range from 3 nm to 50 nm.

An efficient wavelength conversion also takes place through these nanocrystals, wherein the exact position of the excitation of the nitrogen vacancy centres can be adjusted by the size of the nanocrystals. This allows the excitation of the nitrogen vacancy centres to take place even more efficiently, which increases the luminescence intensity and thus the measurement accuracy.

Otherwise, the basic structure remains the same, wherein the LED structure 254 is directly on the substrate 252, the matrix layer 256 arranged thereon, the Bragg mirror 260 arranged thereon and the photodiode structure 262 arranged thereon.

Figure 8:
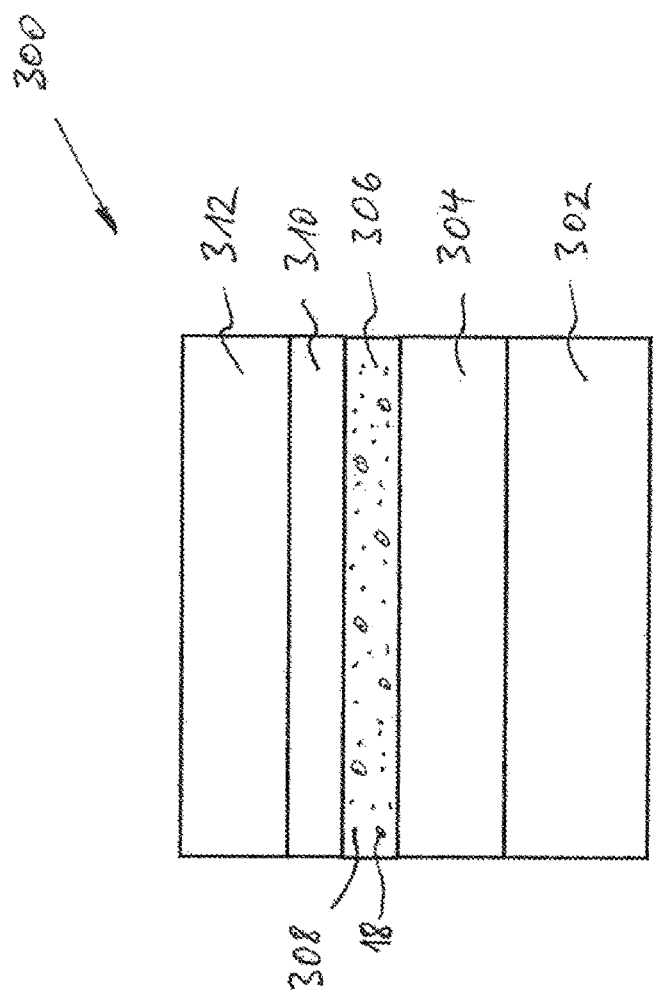
FIG. 8 shows a seventh preferred embodiment of the device for determining the magnetic flux density.

FIG. 8 shows a seventh preferred embodiment of the device 300 for determining the magnetic flux density purely schematically in section.

It can be seen that this device 250 differs from the device 10 of FIG. 2 only in that there are no particles 20 of green phosphorus material, but instead quantum dots 308, for example of CdS, CdSe, CdTe, GaAs and/or InP are present in the uniform matrix layer 306 in addition to the diamond grains 18. These quantum dots were produced by wet chemical methods, such as the hot injection method. If metallic nanoclusters are to be used instead of such quantum dots, the metallic nanoparticles (e.g. Au or Ag) could be reduced from the salt (in the case of Au a gold salt) and then enriched in an organic phase and later dissolved out of it (see e.g. Nadejda Krasteva et al., "Gold nanoparticle/PPI-dendrimer based chemiresistors: Vapor-sensing properties as a function of the dendrimer size", Sensors and Actuators B: Chemical 92 (1-2) pages 137-143 (2003)). Subsequently, the gold particles can be embedded in a dielectric matrix by sol-gel deposition (see e.g. S. Seidel, J. Heitmann et al., "Temperature stable Au nanoparticles embedded in Er3+ doped ZrO2 sol-gel thin films prepared by spin coating.", Thin Solid Films, 606, 13-18 (2016), DOI: 10.1016/j.tsf.2016.03.028), while fully preserving their plasmonic response.

An efficient wavelength conversion also takes place through these quantum dots, wherein the exact position of the excitation of the nitrogen vacancy centres can be adjusted by the size of the quantum dots. This allows the excitation of the nitrogen vacancy centres to take place even more efficiently, which increases the luminescence intensity and thus the measurement accuracy.

Otherwise, the basic structure remains the same here too, wherein the LED structure 304 is directly on the substrate 302, the matrix layer 306 arranged thereon, the Bragg mirror 310 arranged thereon and the photodiode structure 312 arranged thereon.

FIG. 9 shows an eighth preferred embodiment of the device 350 for determining the magnetic flux density purely schematically in section.

It can be seen that, as with the device 200 from FIG. 6, there is no single matrix layer rather two separate layers 356, 358. An LED structure 354 is arranged directly on the substrate 352, a layer 356 with green phosphor material deposited by CVD is arranged thereon, a pure diamond layer 358 is arranged thereon, the Bragg mirror 360 is arranged thereon and the photodiode structure 362 is arranged thereon.

The diamond layer 358 was produced here by CVD and nitrogen vacancy centres were created in it by implanting dopants (for example sulphur) and subsequent low-energy bombardment (1 eV to 20 MeV) with foreign atoms (for example nitrogen).

Reference is made to PCT/EP2020/068110 regarding the production of such diamond coatings with nitrogen vacancy centres, the disclosure content of which is fully included.

In this device 200 too, wavelength conversion also takes place, but here, due to the spatial distance between the diamond layer 358 and phosphor material 356, only a small amount of Förster transfer is to be expected, so that the excitation of the nitrogen vacancy centres in the diamond layer 358 will be predominantly radiative.

From the above, it is clear that the present disclosure provides a device 10, 50, 100, 150, 200, 250, 300, 350 and a method for determining magnetic flux density that provide a simple and inexpensive sensing system that nevertheless has good utility. In particular, a sensor manufactured accordingly can also be used when very small and mobile.

Unless otherwise indicated, all features of the present invention may be freely combined. The features described in the figure description can also be freely combined with the other features as features of the invention, unless otherwise indicated. A limitation of individual features of the exemplary embodiments to the combination with other features of the exemplary embodiments is expressly not intended. In addition, subject matter features of the device can be reformulated and used as process features, and process features can be reformulated as subject matter features of the device. Such a reformulation is thus automatically disclosed.

LIST OF REFERENCE NUMERALS

10 First preferred embodiment of the device for determining the magnetic flux density
12 Substrate
14 LED structure
16 Matrix layer
18 Diamond grains
20 Conversion means
22 Bragg mirror
24 Photodiode structure
50 Second preferred embodiment of the device for determining the magnetic flux density
52 Substrate
54 Photodiode structure
56 Matrix layer
58 Bragg mirror
60 LED structure
100 Third preferred embodiment of the device for determining the magnetic flux density
102 Substrate 104 Photodiode structure
106 Bragg mirror
108 LED structure
110 Matrix layer
150 Fourth preferred embodiment of the device for determining the magnetic flux density
152 Substrate
154 Matrix layer
156 LED structure
158 Bragg mirror
160 Photodiode structure
200 Fifth preferred embodiment of the device for determining the magnetic flux density
202 Substrate
204 LED structure
206 Layer with green phosphor material
208 Layer with diamond grains 18
210 Bragg mirror
212 Photodiode structure
250 Sixth preferred embodiment of the device for determining the magnetic
flux density
252 Substrate
254 LED structure
256 Matrix layer
258 Semiconductor nanocrystals
260 Bragg mirror
262 Photodiode structure
300 Seventh preferred embodiment of the device for determining the magnetic flux density
302 Substrate
304 LED structure
306 Matrix layer
308 Quantum dots
310 Bragg mirror
312 Photodiode structure
350 Eighth preferred embodiment of the device for determining the magnetic flux density
352 Substrate 352
354 LED structure
356 Conversion material, layer with green phosphor material
358 Diamond layer with nitrogen vacancy centres
360 Bragg mirror
362 Photodiode structure

The invention claimed is:

1. A device (10; 50; 100; 150; 200; 250; 300; 350) for determining a magnetic flux density, comprising:
a first material (18; 358), which generates a luminescence and/or a photocurrent upon physical excitation, wherein the luminescence or photocurrent is dependent on the magnetic flux density;
means (14, 20; 60, 20; 108, 20; 156, 20; 204, 20; 254, 20; 304, 308; 354; 358) for generating the physical excitation; and
means (24; 54; 104; 160; 212; 262; 312; 362) for measuring the luminescence or photocurrent with a detection signal representing a strength of the detected luminescence or photocurrent,
wherein the first material (18; 358) and the means (14, 20; 60, 20; 108, 20; 156, 20; 204, 20; 254, 20; 304, 308; 354; 358) for generating the physical excitation are formed in one piece and/or the first material (18; 358) and the means (24; 54; 104; 160; 212; 262; 312; 362) for measuring the luminescence or the photocurrent are formed in one piece,
wherein the means (14, 20; 60, 20; 108, 20; 156, 20; 204, 20; 254, 20; 304, 308; 354; 358) for generating the physical excitation have a source (14; 60; 108; 156; 204; 254; 304; 354) and a conversion means (20; 308; 356),
wherein the source (14; 60; 108; 156; 204; 254; 304; 354) generates a first physical excitation in a light spectrum 200 nm to 500 nm, and
wherein the conversion means (20; 308; 356) absorbs the first physical excitation and emits a second physical excitation in the light spectrum 500 nm to 600 nm.

2. The device (10; 50; 100; 150; 200; 250; 300; 350) according to claim 1,
wherein the first material (18; 358) and the means (14, 20; 60, 20; 108, 20; 156, 20; 204, 20; 254, 20; 304, 308; 354; 358) for generating the physical excitation are formed integrally and/or the first material (18; 358) and the means (24; 54; 104; 160; 212; 262; 312; 362) for measuring the luminescence or the photocurrent are formed integrally and/or
wherein the first material (18; 358) and the means (14, 20; 60, 20; 108, 20; 156, 20; 204, 20; 254, 20; 304, 308; 354; 358) for generating the physical excitation and/or the first material (18; 358) and the means (24; 54; 104; 160; 212; 262; 312; 362) for measuring the luminescence or the photocurrent are present as layers of a layer stack.

3. The device (10; 50; 100; 150; 200; 250; 300; 350) according to claim 1,
wherein means (22; 58; 106; 158; 210; 260; 310; 360) for damping the physical excitation are arranged between the means (14, 20; 60, 20; 108, 20; 156, 20; 204, 20; 254, 20; 304, 308; 354; 358) for generating the physical excitation and the means (24; 54; 104; 160; 212; 262; 312; 362) for measuring the luminescence or of the photocurrent, and
wherein the means for damping are designed as dielectric Bragg mirrors (22; 58; 106; 158; 210; 260; 310; 360).

4. The device (10; 50; 100; 150; 200; 250; 300; 350) according to claim 1,
wherein the first material has a crystal structure with at least one vacancy,
wherein the first material is diamond (18; 358), silicon carbide or silicon and the vacancy is a nitrogen vacancy centre or a nitrogen vacancy centre in combination with a europium vacancy centre, a vanadium vacancy centre or a manganese vacancy centre.

5. The device (10; 50; 100; 150; 200; 250; 300; 350) according to claim 1,
wherein the means (14, 20; 60, 20; 108, 20; 156, 20; 204, 20; 254, 20; 304, 308; 354; 358) for generating the physical excitation provide an electrical or electromagnetic excitation in the optical range, in form of a LASER excitation or an LED excitation, or an excitation by ionizing radiation.

6. The device (10; 50; 100; 150; 200; 250; 300; 350) according to claim 1,
wherein the means (14, 20; 60, 20; 108, 20; 156, 20; 204, 20; 254, 20; 304, 308; 354; 358) for generating the physical excitation comprise a second material from the group consisting of AlN, AlGaN, AlGaInN, C, BN, GaN, GaP, GaAsP, AlGaInP, AlGaP, InGaN, Znü; ZnSe, SiC and Si and/or
wherein the conversion means (20; 308; 356) comprise a third material from the group consisting of phosphor material, metallic nanoclusters, rare earths, CdS, CdSe, CdTe, GaAs and InP and/or wherein at least parts of the means (14, 20; 60, 20; 108, 20; 156, 20; 204, 20; 254, 20; 304, 308) for generating the physical excitation are present in a matrix (16; 56; 110; 154; 256; 306) with the first material (18) as part of a common layer (16; 56; 110; 154; 256; 306).

7. The device (10; 50; 100; 150; 200; 250; 300; 350) according to claim 1,
wherein the first material (18) has grains, which have a grain size in the range from 500 nm to 1 μm and/or
wherein means (24; 54; 104; 160; 212; 262; 312; 362) for measuring the luminescence comprise a photodetector.

8. The device according to claim 1,
wherein means are provided for generating a magnetic flux density,
wherein the means for generating a magnetic flux density are adapted to generate a magnetic flux density of at least 10 mT, and/or
wherein the means for generating a magnetic flux density are adapted to be regulated in such a way that a predetermined luminescence is achieved.

9. A method for producing a device (10; 50; 100; 150; 200; 250; 300; 350) for determining a magnetic flux density,
wherein the device (10; 50; 100; 150; 200; 250; 300; 350) has a first material (18; 358), which generates a luminescence and/or a photocurrent upon physical excitation,
wherein the luminescence or photocurrent is dependent on the magnetic flux density, means (14, 20; 60, 20; 108, 20; 156, 20; 204, 20; 254, 20; 304, 308; 354; 358) for generating the physical excitation and means (24; 54; 104; 160; 212; 262; 312; 362) for measuring the luminescence or photocurrent with a detection signal representing the strength of the detected luminescence signal or photocurrent signal,
the method comprising:
forming the first material (18; 358) and the means (14, 20; 60, 20; 108, 20; 156, 20; 204, 20; 254, 20; 304, 308; 354; 358) for generating the physical excitation in one piece and/or forming the first material (18; 358) and the means (24; 54; 104; 160; 212; 262; 312; 362) for measuring the luminescence or the photocurrent in one piece, and
providing the means (14, 20; 60, 20; 108, 20; 156, 20; 204, 20; 254, 20; 304, 308; 354; 358) for generating the physical excitation with a source (14; 60; 108; 156; 204; 254; 304; 354) and with conversion means (20; 308; 356), wherein the source (14; 60; 108; 156; 204; 254; 304; 354) generates a first physical excitation in the light spectrum 200 nm to 500 nm and the conversion means (20; 308; 356) are selected to convert the first physical excitation into a second physical excitation in the light spectrum 500 nm to 600 nm.

10. The method according to claim 9, wherein an LED structure (14; 60; 108; 156; 204; 254; 304; 354) is generated and the first material (18; 358) is arranged thereon, wherein the first material (18) is arranged in particular in a matrix (16; 56; 110; 154; 256; 306) with the conversion means (20; 308).

11. The method according to claim 9, wherein the first material (18) is deposited using the sol-gel method.

12. The method according to claim 10, wherein
the means (22; 58; 210; 260; 310; 360) for damping are arranged opposite the LED structure (14; 60; 204; 254; 304; 354) on the first material (18; 358) and, thereon, the means (24; 54; 212; 262; 312; 362) for measuring luminescence or the LED structure (14; 60; 204; 254; 304; 354), the first material (18; 358), the means (22; 58; 210; 260; 310; 360) for damping, and the means (24; 54; 212; 262; 312; 362) for measuring the luminescence or the photocurrent are preferably arranged directly on top of one another, or
the means (106; 158) for damping are arranged opposite the first material (18) on the LED structure (108; 156) and the means (104; 160) for measuring the luminescence or photocurrent are arranged thereon, wherein the means (104; 160) for measuring the luminescence or photocurrent, the means (106; 158) for damping, the LED structure (108; 156) and the first material (18) are preferably arranged directly on top of one another.

13. A method for determining a magnetic flux density, comprising:
providing the device (10; 50; 100; 150; 200; 250; 300; 350) according to claim 1,
determining the magnitude of the current magnetic flux density from the value of the measured intensity of the luminescence or of the photocurrent with respect to a normalized curve of the intensity of the luminescence or of the photocurrent with respect to the magnetic flux density.

* * * * *